United States Patent [19]

Horinaga

[11] 4,068,183
[45] Jan. 10, 1978

[54] TRANSISTORIZED SINGLE ENDED PUSH-PULL AMPLIFIER HAVING NO CROSS-OVER DISTORTION

[75] Inventor: Hiroshi Horinaga, Hatano, Japan

[73] Assignee: Sony Corporation, Tokyo, Japan

[21] Appl. No.: 554,550

[22] Filed: Mar. 3, 1975

[30] Foreign Application Priority Data

Mar. 16, 1974 Japan ................................. 49-30299

[51] Int. Cl.² ........................... H03F 3/26; H03F 3/16
[52] U.S. Cl. .................................. 330/253; 330/255; 330/261; 330/277
[58] Field of Search ...................... 330/22, 15, 307, 35, 330/74

[56] References Cited

U.S. PATENT DOCUMENTS

| | | | |
|---|---|---|---|
| 3,092,783 | 6/1963 | Krohn | 330/74 X |
| 3,750,042 | 7/1973 | Peil et al. | 330/30 D X |

*Primary Examiner*—James B. Mullins
*Attorney, Agent, or Firm*—Lewis H. Eslinger; Alvin Sinderbrand

[57] ABSTRACT

An amplifier circuit comprising a single ended push-pull amplifying stage comprised of field effect transistors. A pre-amplifier stage formed of a differential amplifier is coupled to the single ended push-pull amplifying stage for supplying a signal thereto. The output terminals of the differential amplifier are connected to the respective gate electrodes of the field effect transistors included in the single ended push-pull amplifying stage, and load impedance means couple the differential amplifier output terminals to the source or drain electrodes of the field effect transistors. A variable current source is connected to the differential amplifier for controlling the current flowing through the differential amplifier as a function of variations in the operating voltage that is supplied to the load connected to the single ended push-pull amplifying stage. Variations in this operating voltage cause corresponding changes in the differential amplifier current to thereby change the bias level of the signal supplied by the differential amplifier to the single ended push-pull amplifying stage so as to maintain the idling currents of the field effect transistors at a substantially constant level, thus preventing the occurrence of cross-over distortion.

19 Claims, 10 Drawing Figures

TRANSISTORIZED SINGLE ENDED PUSH-PULL AMPLIFIER HAVING NO CROSS-OVER DISTORTION

BACKGROUND OF THE INVENTION

This invention relates to improved amplifier circuits and, in particular, to an improved single ended push-pull amplifier formed of field effect transistors having triode operating characteristics and including a differential amplifier as the pre-amplifying stage thereof.

The use of push-pull amplifiers is well known for providing high power amplification with minimum distortion. The single ended push-pull (SEPP) amplifier is one form of a push-pull amplifier whereby the power efficiency has been greatly increased. A typical SEPP amplifier is described in U.S. Pat. No. 2,936,345 and is comprised of triodes connected in push-pull configuration and being supplied with input signals by a differential amplifier which also is formed of triodes. This SEPP amplifier suffers from inherent disadvantages: the use of the vacuum tubes is undesirable and satisfactory operation has not been readily achieved by substituting conventional transistorized elements for the triodes; and cross-over distortion is quite noticeable.

If a solid-state version of this prior art SEPP amplifier is constructed so as to be manufactured in integrated circuit configuration, the corss-over distortion remains as a highly undesirable feature.

It has been found that if field effect transistors (FET's) are used as the push-pull amplifying components, the problem of cross-over distortion can be solved by using a variable current source in cooperation with the differential amplifying stage of the SEPP amplifier.

OBJECTS OF THE INVENTION

Therefore, it is an object of the present invention to provide an improved single ended push-pull (SEPP) amplifier.

It is another object of this invention to provide an improved SEPP amplifier having no cross-over distortion.

Yet another object of this invention is to provide an improved SEPP amplifier using field effect transistors having triode operating characteristics and including a current control device for preventing cross-over distortion.

An additional object of this invention is to provide an improved SEPP amplifier having field effect transistors as the single ended push-pull amplifying stage and having a pre-amplifier stage formed of a differential amplifier, and wherein a variable current source is provided in cooperation with the differential amplifier to maintain the idling currents of the field effect transistors at a substantially constant level to thereby prevent cross-over distortion.

It is yet a further feature of this invention to provide an improved SEPP amplifier wherein idling currents in the field effect transistors comprising the push-pull amplifying stage are maintained constant notwithstanding changes in the amplifier operating voltage, so as to prevent cross-over distortion.

Various other objects and advantages of the invention will become apparent from the forthcoming detailed description, and the novel features will be particularly pointed out in the appended claims.

SUMMARY OF THE INVENTION

In accordance with the present invention, a SEPP amplifier is provided having a single ended push-pull amplifying stage comprised of field effect transistors for driving a load, and a pre-amplifier stage comprised of a differential amplifier for supplying an input signal to the push-pull amplifying stage; and a variable current source is connected to the differential amplifier for controlling the current flowing through the differential amplifier in accordance with variations in the SEPP operating voltage; to thereby maintain the idling currents of the field effect transistors at a substantially constant level.

BRIEF DESCRIPTION OF THE DRAWINGS

The following detailed description will best be understood in conjunction with the accompanying drawings in which.

DETAILED DESCRIPTION OF CERTAIN PREFERRED EMBODIMENTS

As will be described in greater detail hereinbelow, the SEPP amplifier of the present invention includes field effect transistors. The FET is of the type which has triode operating characteristics, and one such FET is described in "Solid-state Electronics," Vol. 10, page 299 (1967). This type of FET has a low output impedance and a high conversion conductance and, moreover, is capable of operating at high power levels.

Figure 1:
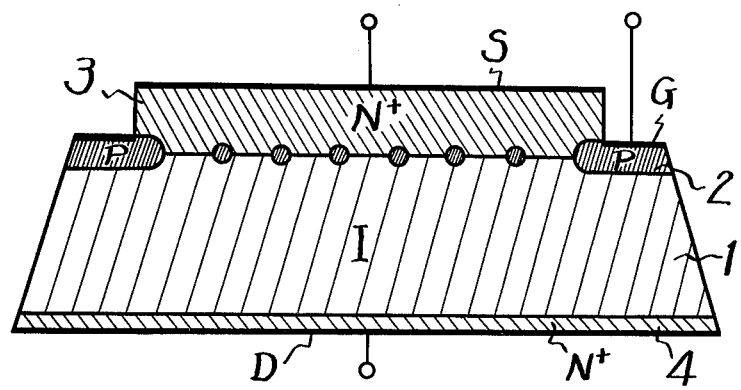
FIG. 1 is a cross-sectional view of one example of an FET which can be used in the amplifying circuit of the present invention.

A cross-sectional illustration of a vertical junction FET which has triode operating characteristics and which exhibits the aforenoted qualities is represented in FIG. 1. As shown, an intrinsic semiconductor region (I) has low impurity concentration and is identified as 1. A ring-shaped P-type semiconductor region 2 is formed on the intrinsic semiconductor region 1. An N+ type semiconductor region 3 having a high impurity concentration is formed over the P-type semiconductor region and over the intrinsic semiconductor region to thus bridge the ring-shaped P-type semiconductor region 2. A drain electrode D is formed beneath the intrinsic semiconductor region 1 and a gate electrode G is formed above the P-type semiconductor region 2. A source electrode S is formed above the N+ type semiconductor region 3. In addition to being ring-shaped, the P-type semiconductor region 2 is formed as a mesh (not shown) such that P-type material is provided within the ring to separate the intrinsic region 1 and the N+ region 3. Finally, an N+ type semiconductor region 4 is formed between the intrinsic semiconductor region 1 and the drain electrode D, as illustrated.

This vertical junction type FET is provided with a small separation between the source electrode S and a channel which is formed around the periphery of the P-type semiconductor region 2. Also, this channel is of a relatively small dimension.

The operating parameters of the illustrated FET are such that the series resistance $R_C$ is very low and its conversion conductance $gm$ is high. The product of this series resistance and conversion conductance is less than unity ($R_c \cdot gm < 1$).

Figure 2:
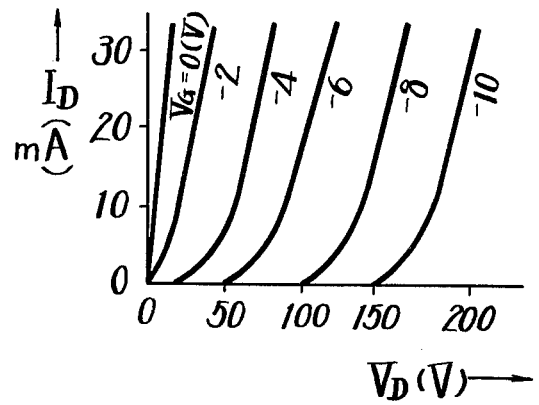
FIG. 2 is a graphical representation of the operating characteristics of the FET of the type depicted in FIG. 1.

The drain voltage-current characteristics ($V_D - I_D$) of this vertical junction type FET are graphically shown in FIG. 2 wherein the ordinate represents the drain current $I_D$ in milliamperes and the abscissa represents the drain voltage $V_D$ in volts. Each curve represents the voltage-current characteristic for a particular gate voltage $V_G$ which is chosen as a selective parameter. In the interest of simplification, only those characteristics for a gate voltage of zero, $-2$, $-4$, $-6$, $-8$ and $-10$ are represented. As is apparent, the characteristic curves graphically shown in FIG. 2 for the vertical junction type FET of FIG. 1 resemble the corresponding operating characteristics of a conventional triode vacuum tube. Advantageously, the series resistance $R_C$ of the FET is held substantially constant notwithstanding voltage variations, and the conversion conductance closely approximates the ideal conversion conductance $gm$ due to the width variation of the FET depletion layer.

Figure 3:
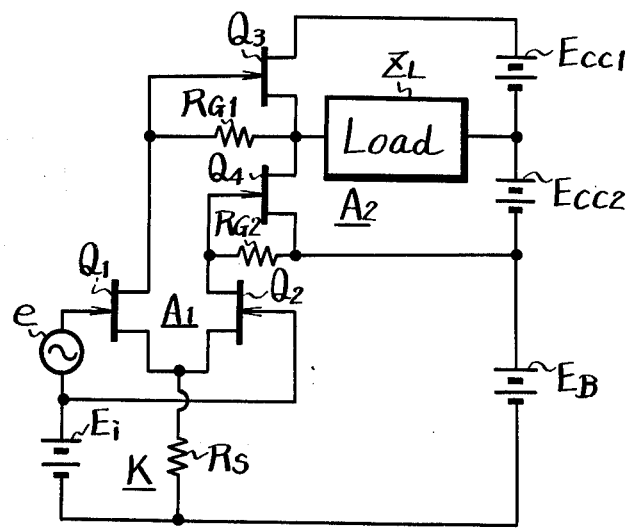
FIGS. 3, 4 and 5 are schematic illustrations of typical SEPP amplifiers.

This FET, having triode operating characteristics, can be used in the push-pull stage of a SEPP amplifier such as the amplifier schematically depicted in FIG. 3. This SEPP amplifier is comprised of an output amplifier circuit $A_2$ comprised of FET's $Q_3$ and $Q_4$ which are disposed in push-pull configuration, and a pre-amplifier stage $A_1$ comprised of a differential amplifier driving circuit. The FET's $Q_3$ and $Q_4$ of the output amplifier circuit $A_2$ are, for example, of the N-channel type. These FET's have the triode operating characteristics described hereinabove with respect to FIGS. 1 and 2.

The drain electrode of the FET $Q_3$ is connected to a positive terminal of a DC voltage source $E_{cc1}$ and the source electrode of this FET is connected through a load $Z_L$ to the negative terminal of the DC voltage source $E_{cc1}$. The load $Z_L$ is driven by the output amplifier circuit $A_2$ and, for example, may comprise a loudspeaker or other impedance load which is to be driven. The source electrode of the FET $Q_3$ is additionally connected to the drain electrode of the FET $Q_4$. The source electrode of the FET $Q_4$ is connected to a negative terminal of a voltage source $E_{cc2}$. As is shown, the positive terminal of the voltage source $E_{cc2}$ is connected to the negative terminal of the voltage source $E_{cc1}$, the junction defined thereby being connected to the load $Z_L$. Accordingly, these DC voltage sources comprise a source for supplying an operating voltage; and if the output voltages ($V_{cc1}$ and $V_{cc2}$) of these voltage sources are equal, equal operating voltages are supplied through the load $Z_L$ across the drain and source electrodes of each of the FET's $Q_3$ and $Q_4$.

As shown, an additional DC voltage source $E_B$ is connected to the source of operating potential and, in particular, a positive terminal of the additional voltage source $E_B$ is connected to the negative terminal of the voltage source $E_{cc2}$ and the negative terminal of the voltage source $E_B$ is connected to further circuitry, to be described. As will soon become apparent, this negative terminal of the voltage source $E_B$ may represent a reference voltage.

The differential amplifier comprising the pre-amplifier stage $A_1$ is formed of differentially-connected transistors $Q_1$ and $Q_2$ having respective control electrodes across which an input signal is applied and having respective output electrodes. The transistors $Q_1$ and $Q_2$ may be conventional transistor devices, such as bi-polar transistors and, for the purpose of the present description, may comprise conventional FET's such as the FET depicted in FIG. 1, a conventional junction-type FET which has pentode operating characteristics or a bi-polar FET. Accordingly, an input signal, represented as a signal source $e$, is differentially connected across the gate electrodes of the transistors $Q_1$ and $Q_2$. A further DC voltage source $E_i$ is connected to the respective gate electrodes of the transistors $Q_1$ and $Q_2$, as shown, to provide, for example, positive bias potentials therein. Accordingly, the negative terminal of the voltage source $E_i$ is connected to the aforenoted reference voltage.

The drain electrode of the transistor $Q_1$ is connected directly to the gate electrode of the FET $Q_3$ and is additionally connected through a gate resistor $R_{G1}$ to the source electrode of the FET $Q_3$. Similarly, the drain electrode of the transistor $Q_2$ is connected directly to the gate electrode of the FET $Q_4$ and is additionally connected through a gate resistor $R_{G2}$ to the source electrode of the FET $Q_4$. Thus, as shown, the respective gate resistors serve to interconnect the gate and source electrodes of the respective FET's $Q_3$ and $Q_4$.

The source electrodes of the transistors $Q_1$ and $Q_2$ are connected in common to a constant current circuit K. This constant current circuit serves to couple the common-connected source electodes to the aforenoted reference voltage. As shown, the constant current circuit K may comprise a resistor $R_S$.

Figure 6:
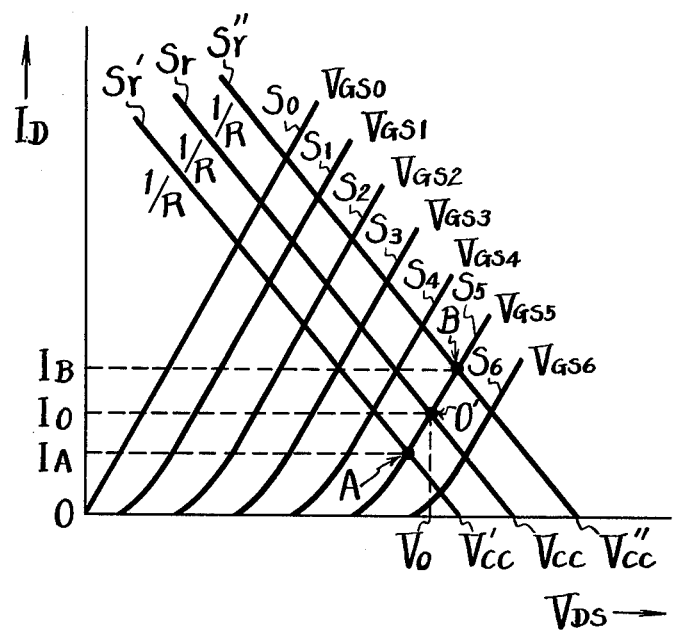
FIGS. 6 and 7 are graphical illustrations which are useful in explaining the operation of the present invention.

The various operational features of the SEPP amplifier shown in FIG. 3 will best be appreciated by the following description thereof taken in conjunction with FIG. 6 which graphically represents the static characteristic curves of the FET which comprises each of the FET's $Q_3$ and $Q_4$. The graphical illustration represents the current-voltage characteristics taken with reference to the FET drain electrode. Thus, the ordinate depicts drain current $I_D$ and the abscissa depicts the voltage $V_{DS}$ across the drain and source electrodes. Each of the curves $S_0, S_1, \ldots S_6$ represents the voltage-current characteristic for a selected voltage $V_{GS}$ across the gate and source electrodes. The gate-source voltage parameters are thus selected as $V_{GS0} (= 0), V_{GS1} \ldots V_{GS6}$.

The output amplifier circuit $A_2$ of the SEPP amplifier can be biased to operate as class A, class AB, or class B amplifiers; however, it is preferred that the amplifier $A_2$ be biased as a class B amplifier. The following description is premised on this class B biassing. If the amplifier load is assumed to be a load resistance having a value R, then a load line $S_r$ can be drawn, as shown, and a quiescent operating point 0' is established if the gate-source voltage of the FET is equal to $V_{GS5}$, corresponding to the curve $S_5$. At this operating point, the drain-source voltage $V_{DS}$ is equal to $V_o$ and the drain current $I_D$ is equal to $I_0$. In the absence of an output signal, and in this quiescent condition, the drain current equal to $I_0$ is the so-called idling current.

If the voltage across the drain and source electrodes of each of the transistors $Q_1$ and $Q_2$ is expressed as $V_{on}$, and if the voltage supplied by the voltage source $E_i$ is expressed as $V_i$, and if the gate-source voltage of the FET $Q_4$ is expressed as $V_{GS}''$, then the voltage $V_B$ provided by the voltage source $E_B$ will have the value:

$$V_B > E_{GS} + V_{GS}'' + V_i + V_{on} \qquad (1)$$

Figure 7:
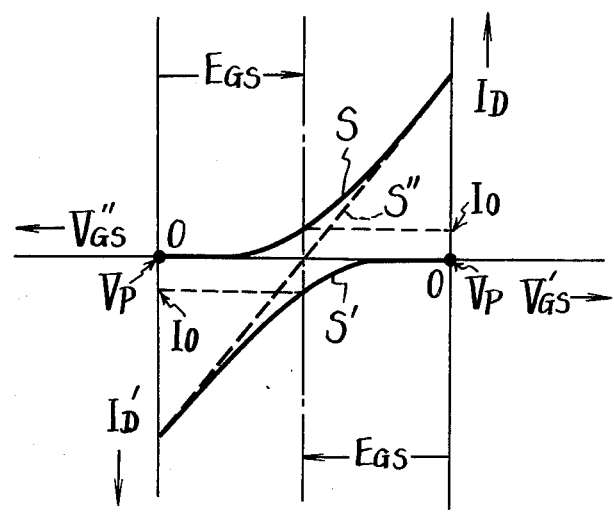

It is recalled that, for the operating point shown in FIG. 6, the gate-source voltage $E_{GS} = V_{GS5}$. Since the output amplifier $A_2$ is biased for class B operation, the composite characteristic relating the drain current $I_D$ to the gate-source voltage $V_{GS}$ for the FET's $Q_3$ and $Q_4$ is shown by the curve $S''$ graphically illustrated in FIG. 7. It is appreciated that this composite curve $S''$ is formed of the characteristic curve S representing the drain current and gate-source voltage relationship of the FET $Q_3$ and the characteristic curve $S'$ representing the drain current and gate-source voltage relationship of the FET $Q_4$. Thus, it should be recognized that the gate-source voltages applied to the respective FET's $Q_3$ and $Q_4$ are of equal amplitude and opposite phase, and are symmetrical with respect to the bias voltage $E_{GS}$.

Now, if the gate-source voltages of the transistors $Q_1$ and $Q_2$ are equal and are represented as $V_{GS}'''$, and if it is recognized that substantially all of the drain current $I_D$ flowing through the transistor $Q_1$ flows through the gate resistor $R_{G1}$, and substantially all of the drain current flowing through the transistor $Q_2$ flows through the gate resistor $R_{G2}$, and if the current through the constant current circuit K is substantially equal to the sum of these drain currents, then the respective gate-source voltages $V_{GS}'$ and $V_{GS}''$ of the FET's $Q_3$ and $Q_4$ can e expressed as:

$$V'_{GS} = \frac{R_{G1}(V_i + V'''_{GS})}{2R_S} \qquad (2)$$

$$V''_{GS} = \frac{R_{G2}(V_i + V'''_{GS})}{2R_S} \qquad (3)$$

Therefore, the gate-source bias voltage of each of the FET's $Q_3$ and $Q_4$ can be determined by suitably selecting the parameters of equations (2) and (3). If the respective gate resistors are constant, then the gate-source bias voltages of the FET's $Q_3$ and $Q_4$ are determined in accordance with the values selected for the DC voltage source $E_i$ and/or the resistance value $R_S$.

It has been assumed that the current flowing through the resistor $R_S$ of the constant current circuit K is constant regardless of the changes in the input AC signal. Thus, the AC gate-source voltages $e_{GS}'$ and $e_{GS}''$ of the FET's $Q_3$ and $Q_4$ can be expressed as:

$$e'_{GS} = -\tfrac{1}{2} e_i \cdot gm \, R_{G1} \qquad (4)$$

$$e''_{GS} = +\tfrac{1}{2} e_i \cdot gm \, R_{G2} \qquad (5)$$

wherein $e_i$ represents the AC input signal supplied by the signal source e, and gm represents the mutual conductance between the FET's $Q_1$ and $Q_2$.

From equations (4) and (5), it is seen that if the FET's $Q_3$ and $Q_4$ are selected to have the same characteristics, and if the gate resistors $R_{G1}$ and $R_{G2}$ are selected to be equal, then the AC gate-source voltages at the respective FET's $Q_3$ and $Q_4$ will have equal amplitude and opposite phase. Consequently, the output produced by the amplifier circuit $A_2$ is linear to thereby linearly drive the load impedance $Z_L$. This linear relationship is graphically shown by the composite curve $S''$ shown in FIG. 7.

If the respective FET's $Q_3$ and $Q_4$ do not have equal gain, then this linear relationship can be established by selecting the gate resistors $R_{G1}$ and $R_{G2}$ to compensate for this difference in gain. As an example, if the voltage gain of the FET $Q_4$ is twice the voltage gain of the FET $Q_3$ so that the cut-off voltage of the FET $Q_4$ is half the cut-off voltage of the FET $Q_3$, then the gate resistor $R_{G1}$ of the FET $Q_3$ is selected to be half the resistance of the gate resistor $R_{G2}$ of the FET $Q_4$. By way of the foregoing, it is seen that the relationship between the voltage gain and the cut-off voltage for the FET follows the general relationship wherein the cut-off voltage is low if the voltage gain is high.

From equations (2) and (3), it is seen that by changing the voltage of the DC voltage source $E_i$, or by changing the resistance of the resistor $R_S$ included in the constant current circuit K, the bias voltage supplied to the FET's $Q_3$ and $Q_4$ can be correspondingly changed. In this manner, desired operation of the SEPP amplifier can be obtained.

Figure 4:
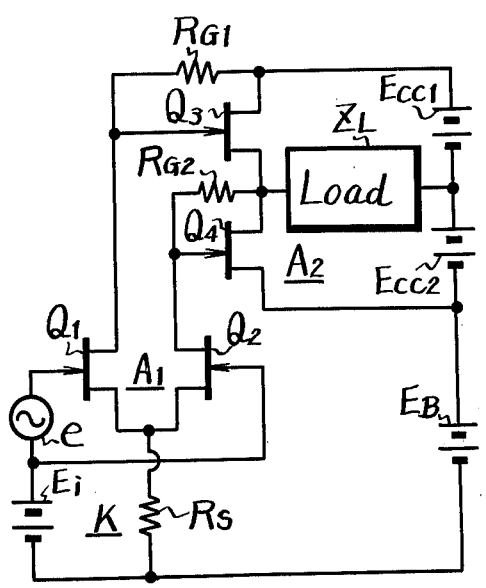

Various modifications of this SEPP amplifier now will be described with reference to FIGS. 4 and 5. In these modified embodiments, like reference numerals are used to identify the same components which have been described previously with respect to FIG. 3. Referring to FIG. 4, the SEPP amplifier is disposed in substantially the same electrical interconnection except for the particular interconnection of the gate resistors $R_{G1}$ and $R_{G2}$. In particular, the gate resistor $R_{G1}$ connects the drain electrode of the FET $Q_3$ to the gate electrode thereof. Thus, as is illustrated, the drain electrode of the transistor $Q_1$ is still directly to the gate electrode of the FET $Q_3$ but now is connected through the load impedance comprising the gate resistor $R_{G1}$ to the drain electrode of the FET $Q_3$. Similarly, the gate resistor $R_{G2}$ couples the drain electrode of the FET $Q_4$ to the gate electrode thereof. Thus, the drain electrode of the transistor $Q_2$ still is connected directly to the gate electrode of the FET $Q_4$ but now is connected through the load impedance comprising the gate resistor $R_{G2}$ to the drain electrode of the FET $Q_4$.

The operation of the SEPP amplifier shown in FIG. 4 approximates the operation of a source-follower. The gate electrodes of the FET's $Q_3$ and $Q_4$ are driven more positive so that the saturation voltage across the drain and source electrodes of the FET's is lower. Consequently, the maximum output from the FET's $Q_3$ and $Q_4$ is increased. However, although the FET's in the FIG. 4 embodiment are able to withstand a greater applied voltage so as to increase the output, the voltage gain of the output amplifier circuit $A_2$ is lower than the voltage gain in the FIG. 3 embodiment.

Figure 5:
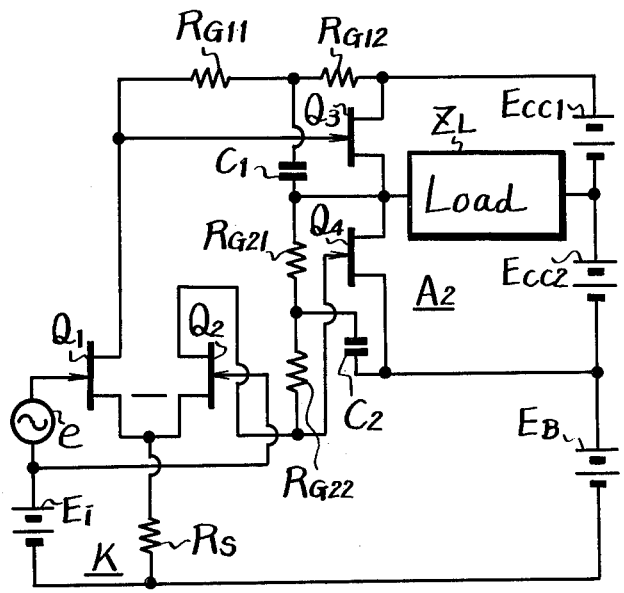

This undesired characteristic of lowered voltage gain in the SEPP amplifier is improved by the embodiment depicted in FIG. 5. The FIG. 5 embodiment is substantially similar to the aforedescribed FIG. 4 embodiment wherein the gate resistor $R_{G1}$ is illustrated as being comprised of series connected resistors $R_{G11}$ and $R_{G12}$. Similarly, the gate resistor $R_{G2}$ is illustrated as being comprised of series connected resistors $R_{G21}$ and $R_{G22}$. Also, in the FIG. 5 embodiment, the junction defined by the series connected gate resistors $R_{G11}$ and $R_{G12}$ is connected to the source electrode of the FET $Q_3$ by a capacitor $C_1$. Similarly, the junction defined by the series connected gate resistors $R_{G21}$ and $R_{G22}$ is connected to the source electrode of the FET $Q_4$ by a capacitor $C_2$. The AC operation of the SEPP amplifier depicted in FIG. 5 approximates the operation of a grounded-source type of amplifier.

It has been found that, when the DC voltages produced by the various voltage sources in the SEPP amplifier embodiment of FIGS. 3–5 vary, due to ambient heat, age, and other external influences, the idling currents of the FET's $Q_3$ and $Q_4$ are changed from the desired condition previously described with respect to FIG. 6. This change in the idling currents causes the so-called cross-over distortion. By way of example, and with reference to the embodiment of FIG. 3 and the graphical representation of the operating characteristics shown in FIG. 6, if the voltages produced by the voltage sources $E_{cc1}$ and $E_{cc2}$ normally are equal to $V_{cc}$, a change in this DC voltage to $V_{cc}'$ results in a corresponding change in the operating point of the FET's from point $0'$ to point A. This causes the idling current to change from the normal idling current $I_0$ to $I_A$. Similarly, a change in the DC voltage produced by the voltage sources $E_{cc1}$ and $E_{cc2}$ from $V_{cc}$ to $V_{cc}''$ results in a change in the operating point from the point $0'$ to the point B with the consequential change in the idling current from $I_0$ to $I_B$.

This problem of changes in the idling currents through the FET's resulting in the cross-over distortion is solved by the present invention. By this invention, a SEPP amplifier having, as an output amplifying circuit, FET's which exhibit triode operating characteristics, and a pre-amplifier stage having a differential amplifier, has the idling currents of the FET's maintained constant to thus prevent the occurrence of cross-over distortion.

Figure 8:
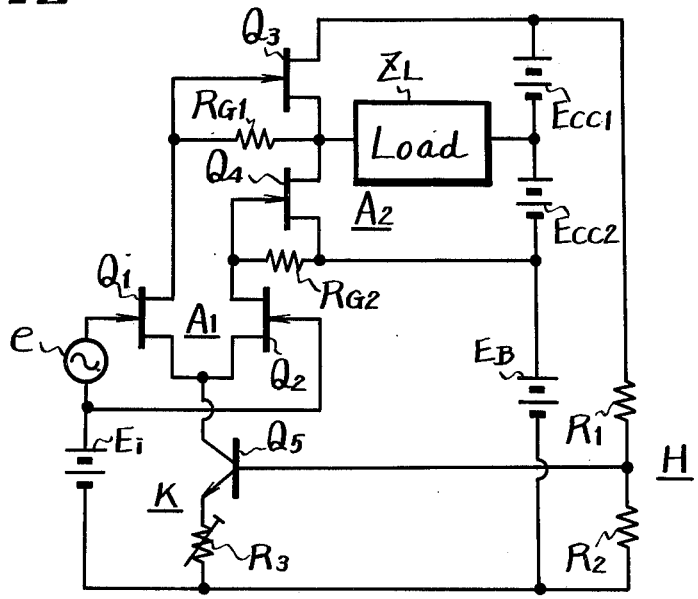
FIGS. 8, 9 and 10 are schematic illustrations of various embodiments of the present invention wherein cross-over distortion in a SEPP amplifier is prevented.

One embodiment of the present invention is illustrated in FIG. 8. The SEPP amplifier shown in FIG. 8 includes a current control circuit connected to the SEPP amplifier which is of the type previously described and illustrated in FIG. 3. Accordingly, those elements of the SEPP amplifier which are similar to the elements previously described with respect to FIG. 3 are identified by like reference numerals, and in the interest of brevity, a detailed description of such elements and their cooperative relationship is omitted. However, it should be recognized that the respective FET's $Q_3$ and $Q_4$ have the triode operating characteristics. Each FET may, in actuality, comprise a single field effect transistor or Darlington-connected FET's. Also, the respective gate resistors may comprise a single resistive impedance element or other load impedance devices which are compatible with the particular configuration of the respective FET's. Similarly, the differential amplifier used as the pre-amplifier stage $A_1$ may be comprised of a pair of differentially-connected transistors or may be formed of differentially-connected transistor devices. Such transistor devices may comprise Darlington-connected transistors, FET's, or the like.

In any event, the SEPP amplifier and its various modifications is connected to the current control circuit which is comprised of a controllable current source, included in the current source K, coupled to a voltage detecting circuit H. The controllable current source comprises a transistor $Q_5$ having its control electrode connected to the voltage detecting circuit H and its output electrodes connected in series between the common-connected source electrodes of the transistors $Q_1$ and $Q_2$ and through a resistor $R_3$ to the aforedescribed reference voltage. The transistor $Q_5$ may be a junction transistor having its base electrode connected to the voltage detecting circuit, its collector electrode connected to the source electrodes of the transistors $Q_1$ and $Q_2$ and its emitter electrode connected to the resistor $R_3$. Of course, alternative types of transistors may be used.

The resistor $R_3$ may comprise a potentiometer and its purpose soon will become apparent.

The combination of the transistor $Q_5$ and the resistor $R_3$ functions as a variable current source for controlling the current flowing through the differential amplifier comprising the pre-amplifier stage $A_1$. This differential amplifier current control is a function of the variation in the operating voltage supplied by the voltage sources $E_{cc1}$ and $E_{cc2}$.

The voltage detecting circuit H is comprised of a voltage divider formed of resistors $R_1$ and $R_2$ connected to the voltage sources $E_{cc1}$ and $E_{cc2}$ as shown. In particular, the total voltage produced by the sources $E_{cc1}$, $E_{cc2}$ and $E_B$ is provided across the voltage divider resistors and a voltage proportional to this total DC voltage is derived at the junction defined by the resistors $R_1$ and $R_2$. As shown, this derived voltage is applied to the control electrode of the transistor $Q_5$.

To understand the operation of the impoved SEPP amplifier shown in FIG. 8, let it be assumed that the DC voltage produced by the respective voltage sources $E_{cc1}$ and $E_{cc2}$ is increased by an amount $\Delta V_{cc}$ so as to be changed from $V_{cc}$ to $V_{cc}''$, as shown in FIG. 6. It is recalled that this change in the DC voltage results in a corresponding change in the idling current of the FET's $Q_3$ and $Q_4$ whereby such idling currents are increased from $I_0$ to $I_B$. To prevent this increase in the idling currents, the base voltage across the gate and source electrodes of the respective FET's must be increased. This increase in the gate-source bias voltage which is necessary to prevent an increase in the idling currents is equal to $\Delta V_{GS}$ and may be expressed as:

$$\Delta V_{GS} = \Delta V_{cc}/\mu \qquad (6)$$

In equation (6), $\mu$ is the voltage amplifying factor of the respective FET's $Q_3$ and $Q_4$.

The gate-source bias voltage of the respective FET's is dependent, to a large degree, upon the current flowing through the respective gate resistors. This gate resistor current also flows through the differential amplifier and through the transistor $Q_5$ and resistor $R_3$. It is appreciated that the differential amplifier current flow is thus dependent upon the DC voltage produced by the voltage source $E_i$ and the resistance value of the resistor $R_3$. Now, if the voltages produced by the sources $E_{cc1}$ and $E_{cc2}$ are increased by $\Delta V_{cc}$, a proportional voltage increase is derived at the junction formed by the resistors $R_1$ and $R_2$ to be applied to the transistor $Q_5$ resulting in an increase in the gate-source voltage of the FET $Q_3$ by an amount $\Delta V_{GS}'$ which can be expressed as:

$$\Delta V_{GS}' = \frac{R_{G1}}{R_3} \frac{R_2}{R_1 + R_2} \cdot \Delta V_{cc} \qquad (7)$$

Similarly, the gate-source voltage of the FET $Q_4$ is increased by an amount $\Delta V_{GS}''$ which may be expressed as:

$$\Delta V''_{GS} = \frac{R_{G2}}{R_3} \frac{R_2}{R_1 + R_2} \cdot \Delta V_{cc} \qquad (8)$$

From equations (6), (7) and (8), the following may be derived:

$$\frac{R_{G1}}{R_3} \cdot \frac{R_2}{R_1 + R_2} = \frac{R_{G2}}{R_3} \cdot \frac{R_2}{R_1 + R_2} = \frac{1}{\mu} \quad (9)$$

Thus, it is seen that the necessary increase $\Delta V_{GS}$ in the gate-source voltage of the FET's to counteract the effects caused by the increased voltage $\Delta V_{cc}$ is determined by the proper selection of the resistors $R_1$, $R_2$ and $R_3$.

As a result of the increase in the DC voltage $\Delta V_{cc}$, the voltage applied to the control electrode of the transistor $Q_5$ is correspondingly increased to thereby reduce the effective resistance between the transistor output electrodes. Consequently, the current flowing through the current circuit K is increased. This causes the current flowing through the differential amplifier to be similarly increased, thus resulting in an increase in the voltage drop across the respective gate resistors $R_{G1}$ and $R_{G2}$. Therefore, the gate-source bias voltages of the respective FET's $Q_3$ and $Q_4$ is increased to thereby prevent an increase in the respective idling currents. Hence, the idling currents of these FET's are maintained substantially constant notwithstanding the aforenoted change in the operating voltage supplied by the DC sources $E_{cc1}$ and $E_{cc2}$.

Although the foregoing has described how the current control circuit connected to the SEPP amplifier maintains the idling currents of the FET's $Q_3$ and $Q_4$ constant even though the DC sources are provided with a voltage increase, it should be readily apparent that such idling currents also are maintained constant in the event of a voltage decrease in the DC sources.

Figure 9:
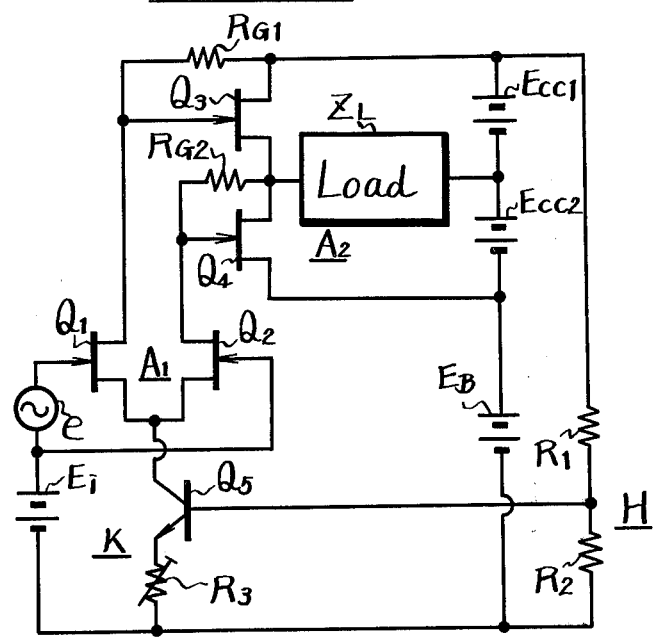

The aforedescribed current control circuit can be coupled to the SEPP amplifier previously described with respect to the FIG. 4 embodiment to thereby prevent cross-over distortion, as will now be described. Referring to FIG. 9, the SEPP amplifier is constructed in the manner shown in FIG. 4 and the current circuit K is formed of the series connection of the transistor $Q_5$ and the resistor $R_3$, this current circuit being controllable in response to detected changes in the operating voltage supplied by the DC sources $E_{cc1}$ and $E_{cc2}$, as derived by the voltage detecting circuit H. As is recognized, the controllable current circuit and the voltage detecting circuit are substantially identical to the embodiment described previously with respect to FIG. 8.

If the voltages produced by the DC souces $E_{cc1}$ and $E_{cc2}$ are respectively equal to $V_{cc}$, then the gate-source bias voltage increases $\Delta V_{GS}'$ of the FET's $Q_3$ and $Q_4$ which are necessary to prevent a change in the FET idling currents may be expressed as:

$$\Delta V'_{GS} = \frac{R_{G1}}{R_3} \cdot \frac{R_2}{R_1 + R_2} \Delta V_{cc} \quad (10)$$

$$\Delta V'_{GS} = \frac{R_{G2}}{R_3} \cdot \frac{R_2}{R_1 + R_2} \Delta V_{cc} \quad (11)$$

It is recalled that the operation of the amplifying output circuit $A_2$ of the type shown in FIG. 9 (and described previously with respect to FIG. 4) approximates the operation of a source-follower amplifier. Accordingly, if an input voltage thereto is represented as $e_i$ and the output voltage is represented as $e_o$, then the voltage gain A may be expressed as:

$$A = e_o/e_i = \mu/(1 + \mu) \quad (12)$$

It is appreciated that this voltage gain expression represents the relationship between the gate-source voltage and the operating voltage of the output amplifying stage. Accordingly, equations (10), (11) and (12) may be combined so that:

$$\frac{R_{G1}}{R_3} \cdot \frac{R_2}{R_1 + R_2} = \frac{R_{G2}}{R_3} \cdot \frac{R_2}{R_1 + R_2} = \frac{1 + \mu}{\mu} \quad (13)$$

Therefore, it is recognized that the idling currents of the FET's $Q_3$ and $Q_4$ in the FIG. 9 embodiment are maintained constant to thereby prevent cross-over distortion by suitably selecting the resistors $R_1$, $R_2$ and $R_3$ in accordance with equation (13).

Figure 10:
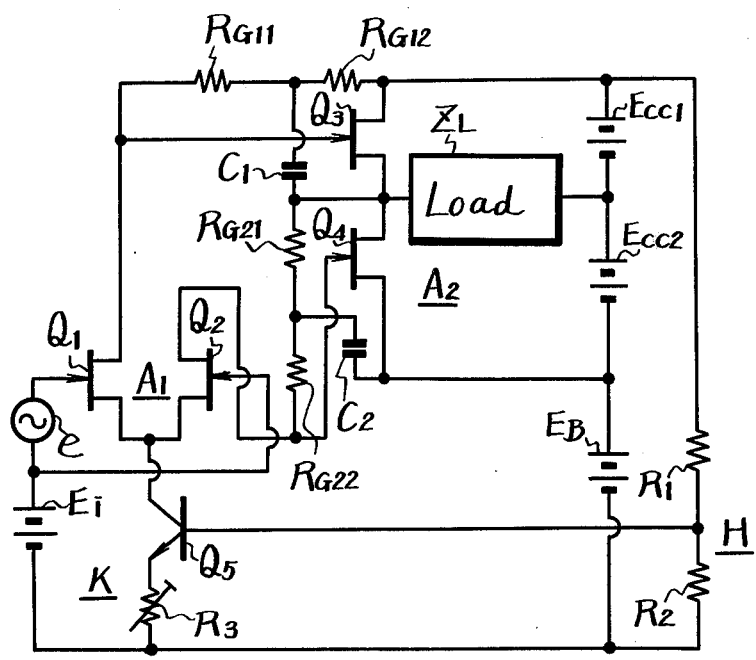

A further embodiment of the improved SEPP amplifier in accordance with the teachings of the present invention is shown in FIG. 10. It is appreciated that this embodiment includes the current control circuit and the voltage detecting circuit which are connected to the SEPP amplifier circuit of the type previously shown and described with respect to FIG. 5. The equations (10) – (13) are applicable to the embodiment of FIG. 10 and, in the interest of brevity, the analysis of the FIG. 10 embodiment need not be provided. Thus, it is appreciated that the idling currents of the FET's $Q_3$ and $Q_4$ in the SEPP amplifier of FIG. 10 are maintained constant to prevent cross-over distortion by suitably selecting the resistors $R_1$, $R_2$ and $R_3$ so that equation (13) is satisfied.

While the invention has been particularly shown and described with reference to certain ones of the preferred embodiments thereof, it will be obvious to those skilled in the art that the aforenoted as well as various other changes and modifications in form and detail may be made to the improved SEPP amplifier without departing from the spirit and scope of the invention. It is therefore intended that the appended claims be interpreted as including all such changes and modifications.

What is claimed is:

1. A transistor amplifier, comprising:
source means for supplying an operating voltage;
first and second field effect transistor means each having triode operating characteristics and each including gate, source and drain electrodes;
means for applying said operating voltage across the drain and source electrodes of said first field effect transistor means through a load;
means for applying said operating voltage across the drain and source electrodes of said second field effect transistor means through said load;
driving means coupled to said first and second field effect transistor means and responsive to an input signal for controlling the alternate conduction of said first and second field effect transistor means, said driving means comprising a differential amplifier formed of differentially-connected transistors each having an input electrode and at least one output electrode, means for applying said input signal to said input electrodes of said differentially-connected transistors, a first load impedance for coupling the output electrode of one of said differentially-connected transistors to said first field effect transistor means to apply a first bias voltage to said first field effect transistor means and to apply a first drive signal to the gate electrode of said first field effect transistor means, and a second load impedance for coupling the output electrode of the other of said differentially-connected transistors to said second field effect transistor means to apply a second bias voltage to said second field effect transistor means and to apply a second drive signal to the gate electrode of said second field effect transistor means; and current control means connected to said differential amplifier for changing the current flowing through said differentially-connected transistors in accordance with changes in the operating voltage supplied by said source means to thereby change said first and second bias voltages applied to said first and second field effect transistor means such that the idling currents of said first and second field effect transistor means are maintained substantially constant.

2. The transistor amplifier of claim 1 wherein said current control means comprises a controllable current source connected to said differential amplifier such that the currents flowing through said output electrodes of said differentially-connected transistors flow through said current source; and voltage detecting means connected to said source means to detect changes in said operating voltage, said voltage detecting means being coupled to said current source to vary the current flow therethrough as a function of said detected changes in said operating voltage.

3. The transistor amplifier of claim 2 wherein said controllable current source comprises a transistor having a control electrode and output electrodes, said output electrodes being connected in series with impedance means between said differential amplifier and a reference voltage.

4. The transistor amplifier of claim 3 wherein said voltage detecting means comprises means for deriving a voltage proportional to said operating voltage, said derived voltage including any changes in said operating voltage; and means for supplying said derived voltage to said control electrode of said transistor.

5. The transistor amplifier of claim 4 wherein said voltage deriving means comprises a voltage divider circuit connected to said source means and having an output terminal coupled to said transistor control electrode.

6. The transistor amplifier of claim 4 wherein said differential amplifier is comprised of differentially-connected field effect transistors having their respective gate electrodes supplied with said input signals, their respective source electrodes connected in common to said current source transistor and their respective drain electrodes coupled to respective ones of said first and second field effect transistor means by said first and second load impedances.

7. The transistor amplifier of claim 6 wherein the source electrode of said first field effect transistor means and the drain electrode of said second field effect transistor means are connected together and in common to said load.

8. The transistor amplifier of claim 7 wherein said first load impedance comprises first resistance means for coupling the drain electrode of one of said differentially-connected transistors to the source electrode of said first field effect transistor means, the gate electrode of said first field effect transistor means being connected through said first resistance means to the source electrode thereof; and wherein said second load impedance comprises second resistance means for coupling the drain electrode of the other of said differentially-connected transistors to the source electrode of said second field effect transistor means, the gate electrode of said second field effect transistor means being connected through said second resistance means to the source electrode thereof.

9. The transistor amplifier of claim 7 wherein said first load impedance comprises first resistance means for coupling the drain electrode of one of said differentially-connected transistors to the drain electrode of said first field effect transistor means, the gate electrode of said first field effect transistor means being connected through said first resistance means to the drain electrode thereof; and wherein said second load impedance means comprises second resistance means for coupling the drain electrode of the other of said differentially connected transistors to the drain electrode of said second field effect transistor means, the gate electrode of said second field effect transistor means being connected through said second resistance means to the drain electrode thereof.

10. The transistor amplifier of claim 9 wherein said first resistance means comprises a first pair of series-connected resistors defining a junction therebetween, and said first load impedance means further comprises a first capacitor for coupling said junction to the source electrode of said first field effect transistor means; and wherein said second resistance means comprises a second pair of series-connected resistors defining a second junction therebetween, and said second load impedance means further comprises a second capacitor for coupling said second junction to the source electrode of said second field effect transistor means.

11. The transistor amplifier of claim 7, further comprising a source of bias potential connected between said reference voltage and said operating voltage source means.

12. Am amplifier circuit, comprising:
a single ended push-pull amplifying stage comprised of first and second field effect transistor means, the source electrode of one of said field effect transistor means being connected to the drain electrode of said other field effect transistor means to form a junction, a load connected to said junction, and means for supplying an operating voltage through said load to each of said field effect transistor means;

a pre-amplifier stage for supplying a signal to said single ended push-pull amplifying stage, said pre-amplifier stage comprised of a differential amplifier formed of differentially-connected transistors to receive an input signal applied thereto and having a pair of output terminals connected to the respective gate electrodes of said first and second field effect transistor means, and first and second load impedance means for coupling the output terminals of said differentially-connected transistors to one of said source and drain electrodes of said first and second field effect transistor means, respectively; and a variable current source connected to said differentially-connected transistors for controlling the current flowing through said differentially-connected transistors as a function of variations in said operating voltage to thereby change the bias level of said signal supplied by said differential amplifier to said single ended push-pull amplifying stage so as to maintain the idling currents of said first and second field effect transistor means at a substantially constant level.

13. The amplifier circuit of claim 12 wherein said variable current source comprises a controllable transistor having its output electrodes connected with resistance means to form a series circuit, said series circuit being connected between the common-connected electrodes of said differentially-connected transistors and a reference potential.

14. The amplifying circuit of claim 13 wherein said variable current source further comprises voltage detecting means for detecting variations in said operating voltage and means for supplying said detected variations to the control electrode of said controllable transistor.

15. The amplifying circuit of claim 14 wherein said voltage detecting means comprises voltage dividing means connected to said operating voltage supply means and having an output terminal coupled to said controllable transistor control electrode.

16. The amplifying circuit of claim 14 wherein said first and second load impedance means couple said output terminals of said differentially-connected transistors to the source electrodes of said first and second field effect transistor means, respectively.

17. The amplifying circuit of claim 14 wherein said first and second load impedance means couple said output terminals of said differentially-connected transistors to the drain electrodes of said first and second field effect transistor means, respectively.

18. The amplifying circuit of claim 17 wherein each of said first and second load impedance means comprises series-connected resistors for interconnecting the drain and gate electrodes of the associated field effect transistor means; and a capacitor connected between the junction defined by said series-connected resistors and the source electrode of said associated field effect transistor means.

19. An amplifier circuit comprising:
a field effect transistor having a source electrode, a gate electrode and a drain electrode;
a first voltage supply connected to said drain electrode;
a second voltage supply;
a resistor connected between said source electrode and said gate electrode;
a constant-current supplying circuitry connected between said gate electrode and said second voltage supply;
an input terminal connected to said gate electrode;
and an output terminal connected to said source electrode.

* * * * *